US008976986B2

(12) United States Patent
Angeloff et al.

(10) Patent No.: US 8,976,986 B2
(45) Date of Patent: Mar. 10, 2015

(54) VOLUME ADJUSTMENT BASED ON LISTENER POSITION

(75) Inventors: Drew Angeloff, Seattle, WA (US); John Clavin, Seattle, WA (US); Robert Walker, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 1115 days.

(21) Appl. No.: 12/563,484

(22) Filed: Sep. 21, 2009

(65) Prior Publication Data

US 2011/0069841 A1 Mar. 24, 2011

(51) Int. Cl.
H04R 5/02 (2006.01)
H03G 3/30 (2006.01)
H04S 7/00 (2006.01)
H03G 3/00 (2006.01)

(52) U.S. Cl.
CPC ............... *H03G 3/3005* (2013.01); *H03G 3/30* (2013.01); *H04S 7/303* (2013.01); *H04S 2400/13* (2013.01)
USPC .......................................... 381/307; 381/108

(58) Field of Classification Search
USPC ......... 381/102–107, 302–303, 58, 59, 95, 96, 381/122, 108, 307; 382/154; 700/259
See application file for complete search history.

(56) References Cited

U.S. PATENT DOCUMENTS

| 4,627,620 | A | 12/1986 | Yang |
| 4,630,910 | A | 12/1986 | Ross et al. |
| 4,645,458 | A | 2/1987 | Williams |
| 4,695,953 | A | 9/1987 | Blair et al. |
| 4,702,475 | A | 10/1987 | Elstein et al. |
| 4,711,543 | A | 12/1987 | Blair et al. |
| 4,751,642 | A | 6/1988 | Silva et al. |
| 4,796,997 | A | 1/1989 | Svetkoff et al. |
| 4,809,065 | A | 2/1989 | Harris et al. |
| 4,817,950 | A | 4/1989 | Goo |
| 4,843,568 | A | 6/1989 | Krueger et al. |
| 4,893,183 | A | 1/1990 | Nayar |
| 4,901,362 | A | 2/1990 | Terzian |
| 4,925,189 | A | 5/1990 | Braeunig |
| 5,101,444 | A | 3/1992 | Wilson et al. |
| 5,148,154 | A | 9/1992 | MacKay et al. |
| 5,184,295 | A | 2/1993 | Mann |

(Continued)

FOREIGN PATENT DOCUMENTS

| CN | 201254344 B | 6/2010 |
| DE | 4027338 A1 | 3/1992 |

(Continued)

OTHER PUBLICATIONS

Japanese Patent Office, Office Action of Japanese Patent Application No. 2012-530897, Nov. 18, 2013, 5 pages.

(Continued)

*Primary Examiner* — Vivian Chin
*Assistant Examiner* — Ammar Hamid
(74) *Attorney, Agent, or Firm* — Sandy Swain; Judy Yee; Micky Minhas

(57) ABSTRACT

Volume adjustment based on listener position is disclosed. A position of one or more speakers is identified, and a position of a listener is tracked. For each of the one or more speakers, a changing distance between that speaker and the listener is assessed. A volume of that speaker is automatically adjusted in real-time based on a current distance between that speaker and the listener.

18 Claims, 7 Drawing Sheets

(56) References Cited

U.S. PATENT DOCUMENTS

| | | |
|---|---|---|
| 5,229,754 A | 7/1993 | Aoki et al. |
| 5,229,756 A | 7/1993 | Kosugi et al. |
| 5,239,463 A | 8/1993 | Blair et al. |
| 5,239,464 A | 8/1993 | Blair et al. |
| 5,288,078 A | 2/1994 | Capper et al. |
| 5,295,491 A | 3/1994 | Gevins |
| 5,320,538 A | 6/1994 | Baum |
| 5,347,306 A | 9/1994 | Nitta |
| 5,385,519 A | 1/1995 | Hsu et al. |
| 5,405,152 A | 4/1995 | Katanics et al. |
| 5,417,210 A | 5/1995 | Funda et al. |
| 5,423,554 A | 6/1995 | Davis |
| 5,454,043 A | 9/1995 | Freeman |
| 5,469,740 A | 11/1995 | French et al. |
| 5,495,576 A | 2/1996 | Ritchey |
| 5,516,105 A | 5/1996 | Eisenbrey et al. |
| 5,524,637 A | 6/1996 | Erickson et al. |
| 5,534,917 A | 7/1996 | MacDougall |
| 5,563,988 A | 10/1996 | Maes et al. |
| 5,577,981 A | 11/1996 | Jarvik |
| 5,580,249 A | 12/1996 | Jacobsen et al. |
| 5,594,469 A | 1/1997 | Freeman et al. |
| 5,597,309 A | 1/1997 | Riess |
| 5,616,078 A | 4/1997 | Oh |
| 5,617,312 A | 4/1997 | Iura et al. |
| 5,638,300 A | 6/1997 | Johnson |
| 5,641,288 A | 6/1997 | Zaenglein |
| 5,682,196 A | 10/1997 | Freeman |
| 5,682,229 A | 10/1997 | Wangler |
| 5,690,582 A | 11/1997 | Ulrich et al. |
| 5,703,367 A | 12/1997 | Hashimoto et al. |
| 5,704,837 A | 1/1998 | Iwasaki et al. |
| 5,715,834 A | 2/1998 | Bergamasco et al. |
| 5,875,108 A | 2/1999 | Hoffberg et al. |
| 5,877,803 A | 3/1999 | Wee et al. |
| 5,913,727 A | 6/1999 | Ahdoot |
| 5,933,125 A | 8/1999 | Fernie |
| 5,980,256 A | 11/1999 | Carmein |
| 5,989,157 A | 11/1999 | Walton |
| 5,995,649 A | 11/1999 | Marugame |
| 6,005,548 A | 12/1999 | Latypov et al. |
| 6,009,210 A | 12/1999 | Kang |
| 6,054,991 A | 4/2000 | Crane et al. |
| 6,066,075 A | 5/2000 | Poulton |
| 6,072,494 A | 6/2000 | Nguyen |
| 6,073,489 A | 6/2000 | French et al. |
| 6,077,201 A | 6/2000 | Cheng et al. |
| 6,098,458 A | 8/2000 | French et al. |
| 6,100,896 A | 8/2000 | Strohecker et al. |
| 6,101,289 A | 8/2000 | Kellner |
| 6,128,003 A | 10/2000 | Smith et al. |
| 6,130,677 A | 10/2000 | Kunz |
| 6,141,463 A | 10/2000 | Covell et al. |
| 6,147,678 A | 11/2000 | Kumar et al. |
| 6,152,856 A | 11/2000 | Studor et al. |
| 6,159,100 A | 12/2000 | Smith |
| 6,173,066 B1 | 1/2001 | Peurach et al. |
| 6,181,343 B1 | 1/2001 | Lyons |
| 6,188,777 B1 | 2/2001 | Darrell et al. |
| 6,215,890 B1 | 4/2001 | Matsuo et al. |
| 6,215,898 B1 | 4/2001 | Woodfill et al. |
| 6,226,396 B1 | 5/2001 | Marugame |
| 6,229,913 B1 | 5/2001 | Nayar et al. |
| 6,256,033 B1 | 7/2001 | Nguyen |
| 6,256,400 B1 | 7/2001 | Takata et al. |
| 6,283,860 B1 | 9/2001 | Lyons et al. |
| 6,289,112 B1 | 9/2001 | Jain et al. |
| 6,299,308 B1 | 10/2001 | Voronka et al. |
| 6,308,565 B1 | 10/2001 | French et al. |
| 6,316,934 B1 | 11/2001 | Amorai-Moriya et al. |
| 6,363,160 B1 | 3/2002 | Bradski et al. |
| 6,384,819 B1 | 5/2002 | Hunter |
| 6,411,744 B1 | 6/2002 | Edwards |
| 6,430,997 B1 | 8/2002 | French et al. |
| 6,476,834 B1 | 11/2002 | Doval et al. |
| 6,496,598 B1 | 12/2002 | Harman |
| 6,503,195 B1 | 1/2003 | Keller et al. |
| 6,532,291 B1 | 3/2003 | McGrath |
| 6,539,931 B2 | 4/2003 | Trajkovic et al. |
| 6,570,555 B1 | 5/2003 | Prevost et al. |
| 6,584,201 B1 | 6/2003 | Konstantinou et al. |
| 6,633,294 B1 | 10/2003 | Rosenthal et al. |
| 6,640,202 B1 | 10/2003 | Dietz et al. |
| 6,661,918 B1 | 12/2003 | Gordon et al. |
| 6,681,031 B2 | 1/2004 | Cohen et al. |
| 6,714,665 B1 | 3/2004 | Hanna et al. |
| 6,731,799 B1 | 5/2004 | Sun et al. |
| 6,738,066 B1 | 5/2004 | Nguyen |
| 6,765,726 B2 | 7/2004 | French et al. |
| 6,788,809 B1 | 9/2004 | Grzeszczuk et al. |
| 6,801,637 B2 | 10/2004 | Voronka et al. |
| 6,873,723 B1 | 3/2005 | Aucsmith et al. |
| 6,876,496 B2 | 4/2005 | French et al. |
| 6,937,742 B2 | 8/2005 | Roberts et al. |
| 6,950,534 B2 | 9/2005 | Cohen et al. |
| 7,003,134 B1 | 2/2006 | Covell et al. |
| 7,036,094 B1 | 4/2006 | Cohen et al. |
| 7,038,855 B2 | 5/2006 | French et al. |
| 7,039,676 B1 | 5/2006 | Day et al. |
| 7,042,440 B2 | 5/2006 | Pryor et al. |
| 7,050,606 B2 | 5/2006 | Paul et al. |
| 7,058,204 B2 | 6/2006 | Hildreth et al. |
| 7,060,957 B2 | 6/2006 | Lange et al. |
| 7,110,558 B1 | 9/2006 | Elliott |
| 7,113,918 B1 | 9/2006 | Ahmad et al. |
| 7,121,946 B2 | 10/2006 | Paul et al. |
| 7,170,492 B2 | 1/2007 | Bell |
| 7,184,048 B2 | 2/2007 | Hunter |
| 7,184,558 B2 | 2/2007 | Yamamoto et al. |
| 7,202,898 B1 | 4/2007 | Braun et al. |
| 7,222,078 B2 | 5/2007 | Abelow |
| 7,227,526 B2 | 6/2007 | Hildreth et al. |
| 7,259,747 B2 | 8/2007 | Bell |
| 7,308,112 B2 | 12/2007 | Fujimura et al. |
| 7,317,836 B2 | 1/2008 | Fujimura et al. |
| 7,348,963 B2 | 3/2008 | Bell |
| 7,359,121 B2 | 4/2008 | French et al. |
| 7,367,887 B2 | 5/2008 | Watabe et al. |
| 7,379,563 B2 | 5/2008 | Shamaie |
| 7,379,566 B2 | 5/2008 | Hildreth |
| 7,389,591 B2 | 6/2008 | Jaiswal et al. |
| 7,412,077 B2 | 8/2008 | Li et al. |
| 7,421,093 B2 | 9/2008 | Hildreth et al. |
| 7,430,312 B2 | 9/2008 | Gu |
| 7,436,496 B2 | 10/2008 | Kawahito |
| 7,450,736 B2 | 11/2008 | Yang et al. |
| 7,452,275 B2 | 11/2008 | Kuraishi |
| 7,460,690 B2 | 12/2008 | Cohen et al. |
| 7,489,812 B2 | 2/2009 | Fox et al. |
| 7,492,915 B2 | 2/2009 | Jahnke |
| 7,536,032 B2 | 5/2009 | Bell |
| 7,555,142 B2 | 6/2009 | Hildreth et al. |
| 7,560,701 B2 | 7/2009 | Oggier et al. |
| 7,570,805 B2 | 8/2009 | Gu |
| 7,574,020 B2 | 8/2009 | Shamaie |
| 7,576,727 B2 | 8/2009 | Bell |
| 7,590,262 B2 | 9/2009 | Fujimura et al. |
| 7,593,552 B2 | 9/2009 | Higaki et al. |
| 7,598,942 B2 | 10/2009 | Underkoffler et al. |
| 7,607,509 B2 | 10/2009 | Schmiz et al. |
| 7,613,313 B2* | 11/2009 | Juppi et al. .............. 381/306 |
| 7,620,202 B2* | 11/2009 | Fujimura et al. ............ 382/103 |
| 7,668,340 B2 | 2/2010 | Cohen et al. |
| 7,680,298 B2 | 3/2010 | Roberts et al. |
| 7,683,954 B2 | 3/2010 | Ichikawa et al. |
| 7,684,592 B2 | 3/2010 | Paul et al. |
| 7,701,439 B2 | 4/2010 | Hillis et al. |
| 7,702,130 B2 | 4/2010 | Im et al. |
| 7,704,135 B2 | 4/2010 | Harrison, Jr. |
| 7,710,391 B2 | 5/2010 | Bell et al. |
| 7,729,530 B2 | 6/2010 | Antonov et al. |
| 7,746,345 B2 | 6/2010 | Hunter |
| 7,760,182 B2 | 7/2010 | Ahmad et al. |
| 7,809,167 B2 | 10/2010 | Bell |

(56) References Cited

U.S. PATENT DOCUMENTS

| | | | |
|---|---|---|---|
| 7,834,846 | B1 | 11/2010 | Bell |
| 7,852,262 | B2 | 12/2010 | Namineni et al. |
| RE42,256 | E | 3/2011 | Edwards |
| 7,898,522 | B2 | 3/2011 | Hildreth et al. |
| 7,949,139 | B2* | 5/2011 | McKee Cooper ............... 381/58 |
| 8,035,612 | B2 | 10/2011 | Bell et al. |
| 8,035,614 | B2 | 10/2011 | Bell et al. |
| 8,035,624 | B2 | 10/2011 | Bell et al. |
| 8,072,470 | B2 | 12/2011 | Marks |
| 8,189,825 | B2* | 5/2012 | Breed ........................... 381/302 |
| 8,588,431 | B2* | 11/2013 | Aggarwal et al. ............... 381/58 |
| 2004/0037450 | A1* | 2/2004 | Bradski ........................ 382/103 |
| 2004/0104935 | A1 | 6/2004 | Williamson et al. |
| 2005/0063556 | A1* | 3/2005 | McEachen et al. ........... 381/104 |
| 2006/0239471 | A1 | 10/2006 | Mao et al. |
| 2008/0026838 | A1 | 1/2008 | Dunstan et al. |
| 2009/0202114 | A1 | 8/2009 | Morin et al. |

FOREIGN PATENT DOCUMENTS

| | | |
|---|---|---|
| EP | 0583061 A2 | 2/1994 |
| EP | 2111901 A2 | 10/2009 |
| JP | 63209300 A | 8/1988 |
| JP | 03010500 A | 1/1991 |
| JP | H04280198 A | 10/1992 |
| JP | 08044490 A1 | 2/1996 |
| JP | H11146500 A | 5/1999 |
| JP | 2001054200 A | 2/2001 |
| JP | 2003032799 A | 1/2003 |
| JP | 2004514359 A | 5/2004 |
| JP | 2007514350 A | 5/2007 |
| JP | 2007281789 A | 10/2007 |
| JP | 2008061137 A | 3/2008 |
| JP | 2009500711 A | 1/2009 |
| JP | 2009508581 A | 3/2009 |
| KR | 1020000014636 A | 3/2000 |
| WO | 93/10708 A1 | 6/1993 |
| WO | 97/17598 A1 | 5/1997 |
| WO | 99/44698 A1 | 9/1999 |
| WO | 0241664 A2 | 5/2002 |
| WO | 2007004134 A2 | 1/2007 |
| WO | 2009069832 A1 | 6/2009 |
| WO | 2009131658 A2 | 10/2009 |

OTHER PUBLICATIONS

Kanade et al., "A Stereo Machine for Video-rate Dense Depth Mapping and Its New Applications", IEEE Computer Society Conference on Computer Vision and Pattern Recognition, 1996, pp. 196-202, The Robotics Institute, Carnegie Mellon University, Pittsburgh, PA.

Miyagawa et al., "CCD-Based Range Finding Sensor", Oct. 1997, pp. 1648-1652, vol. 44 No. 10, IEEE Transactions on Electron Devices.

Rosenhahn et al., "Automatic Human Model Generation", 2005, pp. 41-48, University of Auckland (CITR), New Zealand.

Aggarwal et al., "Human Motion Analysis: A Review", IEEE Nonrigid and Articulated Motion Workshop, 1997, University of Texas at Austin, Austin, TX.

Shao et al., "An Open System Architecture for a Multimedia and Multimodal User Interface", Aug. 24, 1998, Japanese Society for Rehabilitation of Persons with Disabilities (JSRPD), Japan.

Kohler, "Special Topics of Gesture Recognition Applied in Intelligent Home Environments", In Proceedings of the Gesture Workshop, 1998, pp. 285-296, Germany.

Kohler, "Vision Based Remote Control in Intelligent Home Environments", University of Erlangen-Nuremberg/Germany, 1996, pp. 147-154, Germany.

Kohler, "Technical Details and Ergonomical Aspects of Gesture Recognition applied in Intelligent Home Environments", 1997, Germany.

Hasegawa et al., "Human-Scale Haptic Interaction with a Reactive Virtual Human in a Real-Time Physics Simulator", Jul. 2006, vol. 4, No. 3, Article 6C, ACM Computers in Entertainment, New York, NY.

Qian et al., "A Gesture-Driven Multimodal Interactive Dance System", Jun. 2004, pp. 1579-1582, IEEE International Conference on Multimedia and Expo (ICME), Taipei, Taiwan.

Zhao, "Dressed Human Modeling, Detection, and Parts Localization", 2001, The Robotics Institute, Carnegie Mellon University, Pittsburgh, PA.

He, "Generation of Human Body Models", Apr. 2005, University of Auckland, New Zealand.

Isard et al., "Condensation—Conditional Density Propagation for Visual Tracking", 1998, pp. 5-28, International Journal of Computer Vision 29(1), Netherlands.

Livingston, "Vision-based Tracking with Dynamic Structured Light for Video See-through Augmented Reality", 1998, University of North Carolina at Chapel Hill, North Carolina, USA.

Wren et al., "Pfinder: Real-Time Tracking of the Human Body", MIT Media Laboratory Perceptual Computing Section Technical Report No. 353, Jul. 1997, vol. 19, No. 7, pp. 780-785, IEEE Transactions on Pattern Analysis and Machine Intelligence, Caimbridge, MA.

Breen et al., "Interactive Occlusion and Collusion of Real and Virtual Objects in Augmented Reality", Technical Report ECRC-95-02, 1995, European Computer-Industry Research Center GmbH, Munich, Germany.

Freeman et al., "Television Control by Hand Gestures", Dec. 1994, Mitsubishi Electric Research Laboratories, TR94-24, Caimbridge, MA.

Hongo et al., "Focus of Attention for Face and Hand Gesture Recognition Using Multiple Cameras", Mar. 2000, pp. 156-161, 4th IEEE International Conference on Automatic Face and Gesture Recognition, Grenoble, France.

Pavlovic et al., "Visual Interpretation of Hand Gestures for Human-Computer Interaction: A Review", Jul. 1997, pp. 677-695, vol. 19, No. 7, IEEE Transactions on Pattern Analysis and Machine Intelligence.

Azarbayejani et al., "Visually Controlled Graphics", Jun. 1993, vol. 15, No. 6, IEEE Transactions on Pattern Analysis and Machine Intelligence.

Granieri et al., "Simulating Humans in VR", The British Computer Society, Oct. 1994, Academic Press.

Brogan et al., "Dynamically Simulated Characters in Virtual Environments", Sep./Oct. 1998, pp. 2-13, vol. 18, Issue 5, IEEE Computer Graphics and Applications.

Fisher et al., "Virtual Environment Display System", ACM Workshop on Interactive 3D Graphics, Oct. 1986, Chapel Hill, NC.

"Virtual High Anxiety", Tech Update, Aug. 1995, pp. 22.

Sheridan et al., "Virtual Reality Check", Technology Review, Oct. 1993, pp. 22-28, vol. 96, No. 7.

Stevens, "Flights into Virtual Reality Treating Real World Disorders", The Washington Post, Mar. 27, 1995, Science Psychology, 2 pages.

"Simulation and Training", 1994, Division Incorporated.

State Intellectual Property Office of the People's Republic of China, Notice on the Third Office Action of Chinese Patent Application No. 201080041897.2, Mar. 15, 2013, 9 pages.

"International Search Report", Mailed Date: May 31, 2011, Application No. PCT/US2010/046879, Filed Date: Aug. 27, 2010, pp. 8.

Azuma, et al., "Recent Advances in Augmented Reality", retrieved at <<http://ieeexplore.ieee.org/stamp/stamp.jsp?arnumber=00963459>>, Computer Graphics and Applications, IEEE, Nov. 2001, vol. 21, Issue: 6, pp. 34-47.

"User's Instructions: The Senso System", retrieved at <<http://www.widex.com/Products/~/media/Widex%20COM/Downloads/PDF/SensoP/9%20514%200016%20001%2002.pdf>>, Aug. 24, 2009, pp. 17.

Japanese Patent Office, Office Action Issued in Russian Patent Application No. 2012110603, Oct. 20, 2014, 3 Pages.

Russian Patent Office, Notice of Allowance Issued in Japan Patent Application No. 2013-530897, Dec. 2, 2014, 3 Pages.

* cited by examiner

VOLUME ADJUSTMENT BASED ON LISTENER POSITION

BACKGROUND

Audio systems can be used in a variety of different applications. For example, modern console gaming systems are configured to take advantage of multi-channel surround sound systems capable of playing different sounds out of several different speakers.

SUMMARY

The present disclosure is directed to real-time audio adjustments made to influence the perceived volume of a listener. The position of a listener is tracked in real-time. As the position of the listener changes relative to one or more speakers, the individual volumes of the one or more speakers are adjusted according to a predetermined function based on the distance between the listener and the speaker(s).

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION

The present disclosure is directed to audio attenuation and amplification based on a listener's position relative to one or more speakers. While described below in the context of a gaming system, it is to be understood that audio attenuation and amplification based on a listener's position relative to one or more speakers, as described herein, may be used in a number of different applications.

Gaming systems incorporating one or more speakers can be controlled at least in part by the movement of a player (i.e., listener) within a physical space. For example, a player holding a motion sensing controller can cause a virtual avatar to swing a bat in game space by swinging the motion sensing controller in world space. As another example, a vision-based system can use one or more cameras to track the movements of the player, and such movements may be translated into game controls. In such systems, as the player moves about a space containing one or more speakers, the sound volume perceived by the player may change. For example, as the distance from a player to a sound source increases (i.e., the player moves away from a speaker), the sound volume perceived by the player may decrease. Likewise, as the distance from a player to a sound source decreases (i.e., the player moves toward a speaker), the sound volume perceived by the player may increase. Thus, the sound volume perceived by the player varies with player position.

In such a scenario, the sound volume perceived by the player may be too loud or too quiet when a player gets too close or too far away, respectively, from a speaker. Player discomfort may result when the perceived volume is too loud. When the perceived volume is too quiet, the sound may become inaudible to the player. Furthermore, when there is more than one speaker in the environment, e.g., in a surround sound system, the balance of sound may not be preserved as the player moves about the physical space. These and other issues relating to perceived volume can be detrimental to the player experience.

By adjusting speaker volume based on a player position, the sound volume perceived by the player may be regulated to remain in a desired range and balance. The adjusting may include amplifying or attenuating a volume of a sound source or multiple sound sources based on a player's position.

Figure 1:
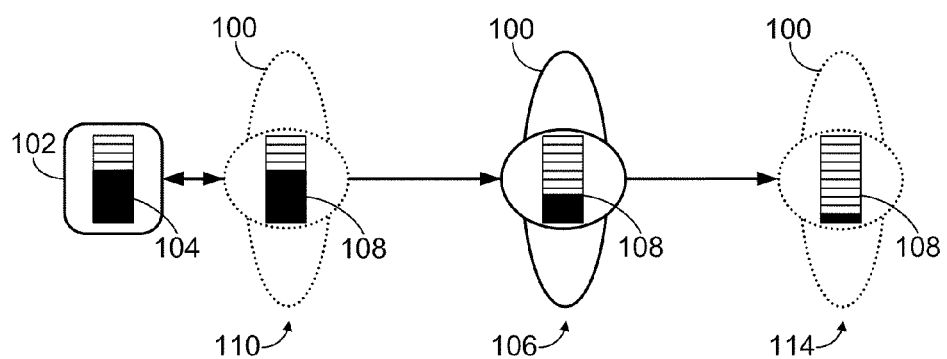
FIG. 1 shows an example of how perceived volume varies as the distance between a player and a speaker changes.

FIG. 1 shows an example of how volume perceived by a player 100 can vary as the position of player 100 changes relative to a speaker 102. The volume of sound emitted by the speaker 102 is indicated by meter 104 and the sound volume perceived by player 100 is indicated by meter 108. Such a metering convention is used throughout this disclosure. When a meter is used in conjunction with a speaker (e.g., speaker 102), the relative amount of the meter filled with black is indicative of a relative volume of the speaker (i.e., more black corresponds to more output volume and less black corresponds to less output volume). When a meter is used in conjunction with a listener (e.g., player 100), the relative amount of the meter filled with black is indicative of a relative volume perceived by the listener (i.e., more black corresponds to louder perceived sounds and less black corresponds to quieter perceived sounds).

As shown in FIG. 1, when a volume of speaker 102 is held at a constant level, the resulting sounds perceived by player 100 change in proportion to a distance of the player from the speaker. In particular, player 100 perceives relatively loud sounds at position 110 relatively close to speaker 102, relatively quiet sounds at position 114 relatively far from speaker 102, and relatively intermediate sounds at position 106 at an intermediate distance from speaker 102.

As described in detail below, the relative volume of a sound source may be modulated in real-time based on a listener's position in order to regulate the perceived volume of that sound source to the listener. In order to regulate volume in such a manner, a listener's position in a physical space is tracked relative to one or more sound sources. It is to be understood that virtually any real-time tracking technique can be used without departing from the scope of this disclosure. Furthermore, it is to be understood that real-time adjustments, as described herein, may include a short delay caused by the processing time of a computing system.

In one example, a gaming system may track the position of a player holding a motion sensing detector. As another example, a pressure-sensing floor mat may report the position of a player positioned on the mat to a gaming system. As another example, acoustic profiling may be used to track the position of a player. Another example of tracking the position of a player is shown in FIG. 2.

Figure 2:
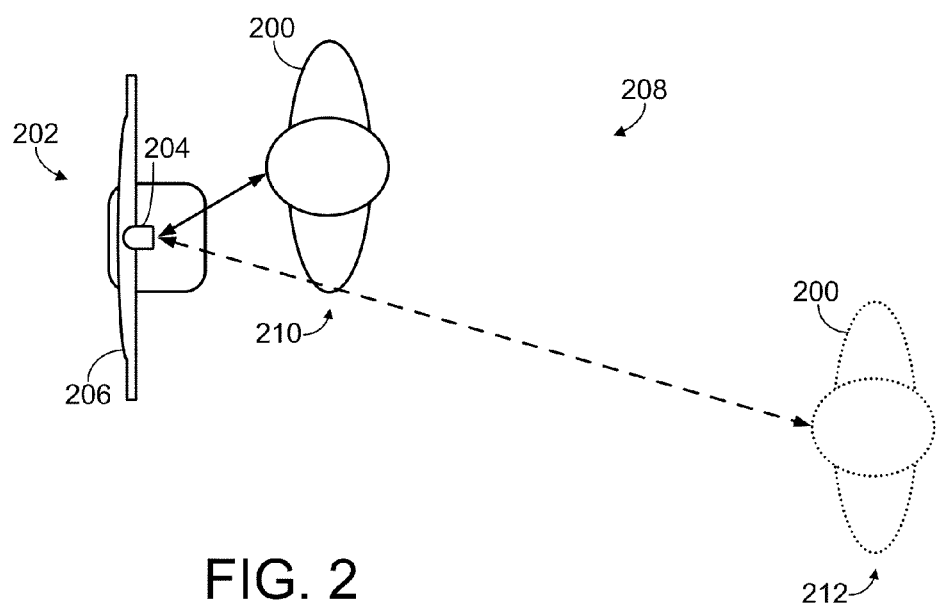
FIG. 2 somewhat schematically shows an example system for tracking the position of a player in accordance with an embodiment of the present disclosure.

FIG. 2 shows an example of a vision-based computing system 202 used to track the movements of a player 200. Computing system 202 may include a gaming console that may be used to play a variety of different games, play one or more different media types, and/or control or manipulate non-game applications. Computing system 202 may also include a display device 206. Display device 206 may be a high-definition television, for example, and may be used to present visual information to players, such as player 200.

In FIG. 2, computing system 202 includes a capture device 204. Capture device 204 may include any input mechanism which can visually identify the position of a player, e.g., player 200. For example, capture device 204 may be configured to capture video with depth information via any suitable technique (e.g., time-of-flight, structured light, stereo image, etc.). As such, capture device 204 may include a depth camera, a video camera, stereo cameras, and/or other suitable capture devices.

In FIG. 2, a player 200 is shown at a first position 210. Capture device 204 may receive a depth image of the scene shown generally at 208 which includes player 200 at position 210. The computing system may then recognize player 200 at position 210 in the depth image acquired from capture device 204. For example, the computing system may use skeletal data or head tracking to identify player 200 in the depth image. Once the system recognizes player 200 at position 210 in the depth image, the system may identify positional information of the player. The positional information may include three-dimensional coordinate data, for example. In some embodiments, computing system 202 may locate a position of a particular player body part or region (e.g., ear, center of head, etc.) within a three-dimensional world space.

Capture device 204 may monitor the position of player 200 and/or a particular part of player 200 in real-time by receiving a plurality of depth images of scene 208 containing player 200. Thus, for example, if player 200 moves to a second position 212 farther away from capture device 204, another depth image, or series of depth images, may be received by capture device 204. The depth image(s) of the scene with player 200 at position 212 may then be used by computing system 202 to obtain positional information, e.g., coordinates of player 200 and/or particular part of player 200 within a three-dimensional world space. In this way system 202 may track the position of the player in three-dimensional space in real-time.

Figure 3A:
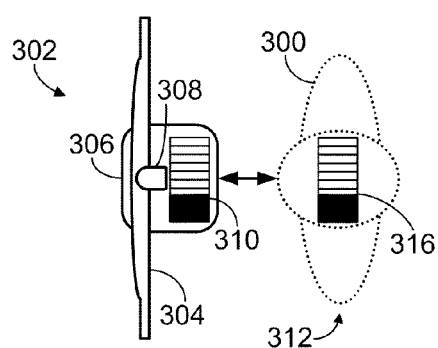
FIGS. 3A and 3B show examples of speaker volume adjustments made in response to a changing player position.
Figure 3B:
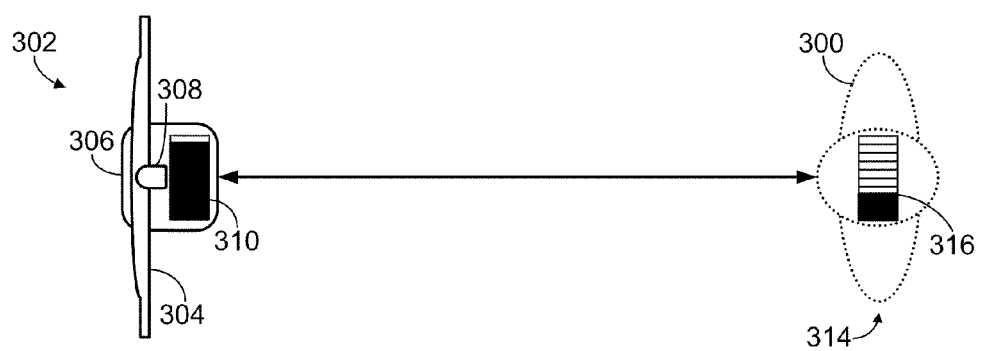

Based on player position tracking as described above, sound volume emitted from one or more sound sources may be regulated to achieve a desired sound balance perceived by the player. FIGS. 3A and 3B show an example of volume regulation as a player 300 moves closer and farther away from a sound source.

In FIGS. 3A and 3B a computing system 302, e.g., a gaming system, is shown. In this example, computing system 302 includes a display device 304, a speaker 306, and a capture device 308, e.g., a depth camera.

In FIG. 3A, when player 300 is at a first position 312 relatively close to speaker 306, the speaker volume is decreased to a level indicated by meter 310. The decrease in speaker volume compensates for the decreased distance between player 300 and the speaker 306. As such, the sound volume perceived by player 300 at position 312 can be maintained at a desired level indicated by meter 316.

Likewise, if player 300 moves to a second position relatively far away from speaker 306, e.g., to position 314 in FIG. 3B, the speaker volume is increased to a level indicated by meter 310 in FIG. 3B. The increase in speaker volume compensates for the increased distance between player 300 and the speaker 306. As such, the sound volume perceived by player 300 at position 314 can be maintained at a desired level indicated by meter 316.

The volume can be automatically regulated in real-time using any suitable method. In some embodiments, a channel-specific audio output level can be adjusted for a particular speaker. In other words, a gaming console or other computing system may adjust a level of an audio output sent to an amplifier so that the resulting volume from the speaker changes without the amplification level of the amplifier changing. In some embodiments, the amplification level of an amplifier may be changed in real-time.

Figure 4A:
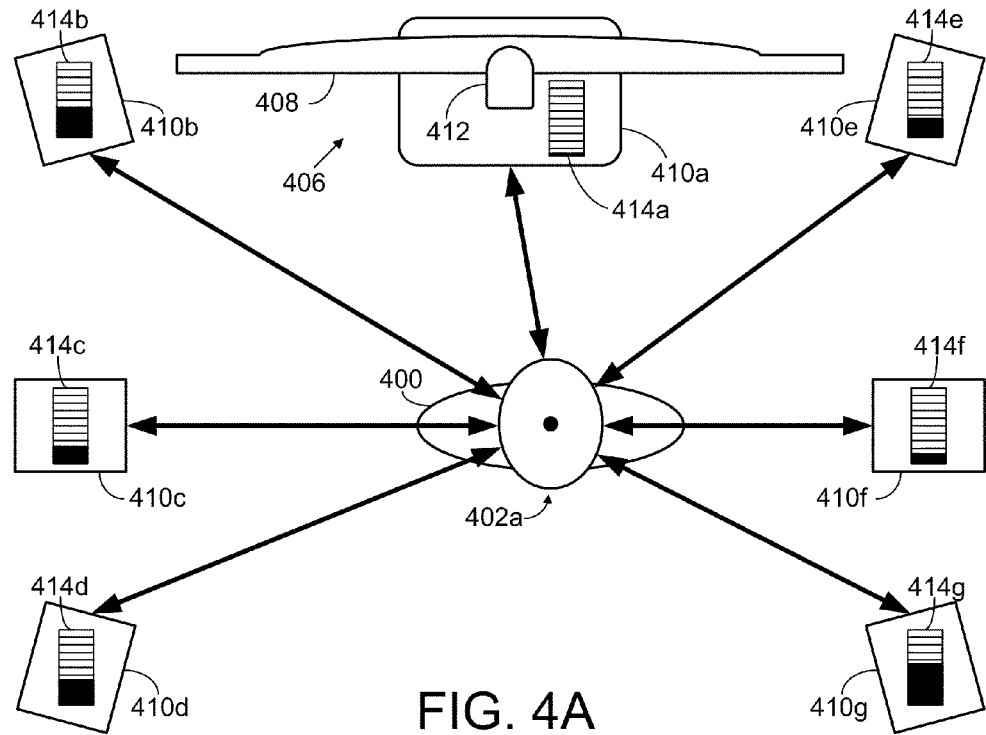
FIGS. 4A and 4B show examples of speaker volume adjustments made in response to a position of a player in a surround sound system.
Figure 4B:
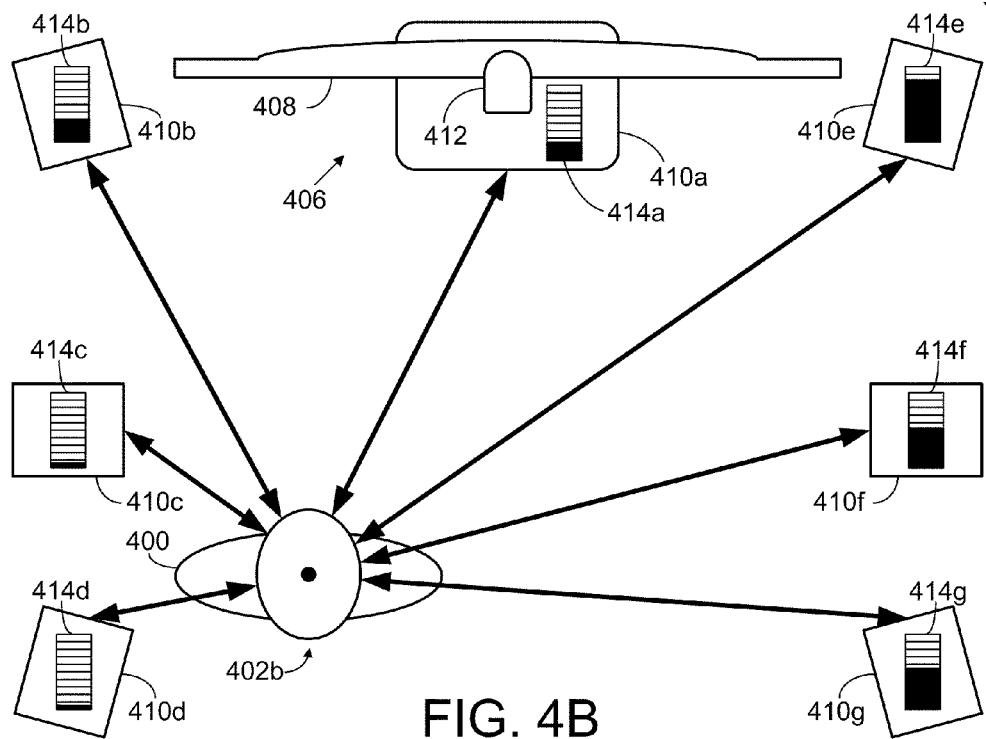

FIGS. 4A and 4B show examples of regulating volume for a situation in which there is a plurality of speakers set up throughout a room, for example in a surround sound system. In such a situation, the concepts described above with reference to FIGS. 3A and 3B can be applied to two or more of the speakers in the surround sound system.

FIGS. 4A and 4B show a computing system 406, e.g., a gaming system, that includes a display device 408, a capture device 412, and a plurality of surround sound speakers (e.g., speaker 410a, speaker 410b, speaker 410c, speaker 410d, speaker 410e, speaker 410f, speaker 410g).

In FIG. 4A, player 400 is at a first position 402a in a room. The position of player 400 may be determined by capture device 412 as described above with regard to FIG. 2. The volume levels of the surround sound speakers are adjusted to the levels indicated by respective meters (e.g., meter 414a, meter 414b, meter 414c, meter 414d, meter 414e, meter 414f, meter 414g) in response to the position of player 400. The speaker volume adjustments shown in FIG. 4A are based on the respective distances from a given speaker to player 400 as indicated by arrows. The speaker volume adjustments maintain a desired volume and balance of sound as perceived by player 400 at position 402a.

As shown in FIG. 4B, when player 400 moves to a different position 402b, as tracked by capture device 204, the volume levels of speakers 410a-410g are automatically adjusted in real-time by computing system 406 to the levels indicated by respective meters 414a-414g. The speaker volume adjustments shown in FIG. 4B are based on the respective distances from a given speaker to player 400 as indicated by arrows and serve to maintain a desired volume and balance of sound as perceived by player 400 at position 402b.

Figure 5:
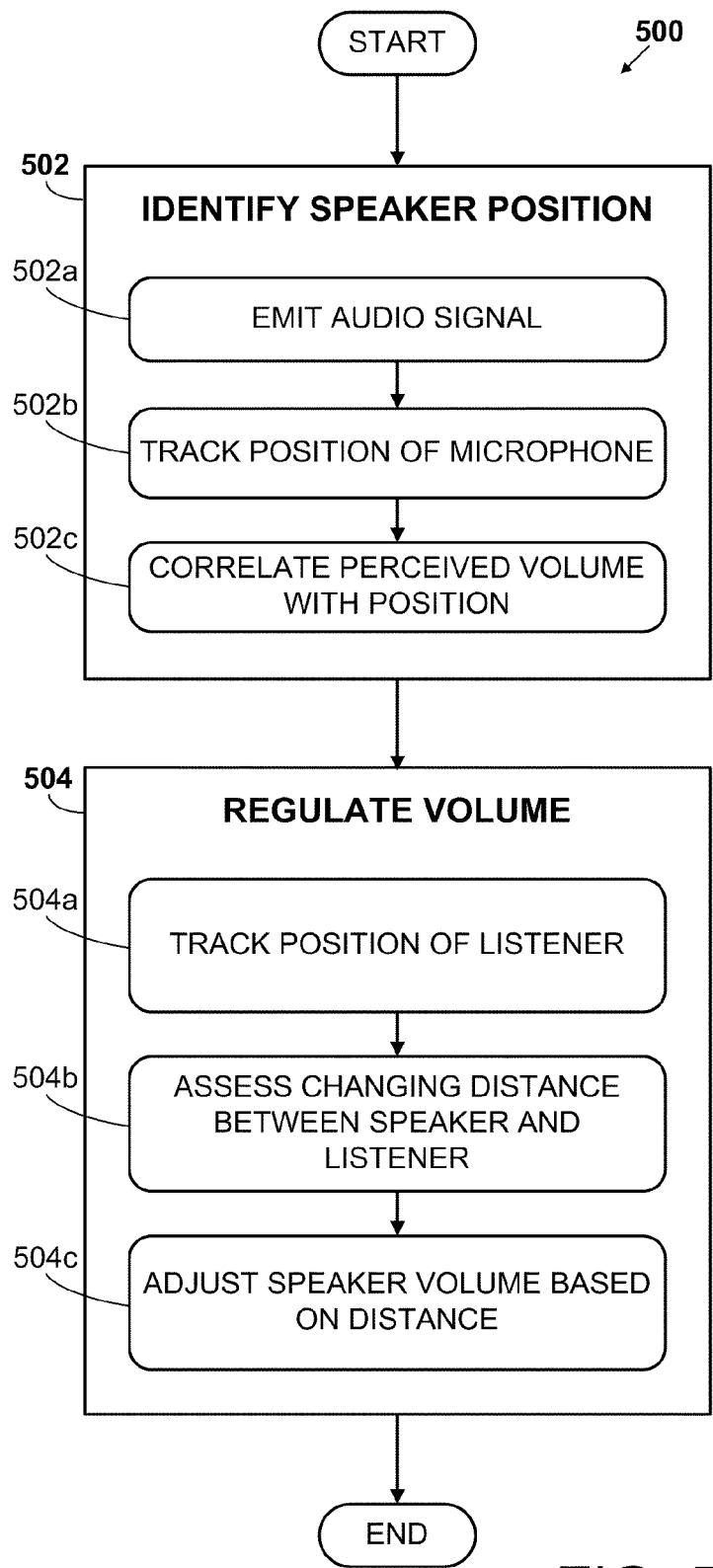
FIG. 5 shows an example method of regulating volume based on a position of a player in accordance with an embodiment of the present disclosure.

FIG. 5 shows an example method 500 of regulating volume based on a position of a player in a scenario such as shown in FIGS. 3A-4B.

At 502, method 500 includes identifying a position of one or more speakers. One or more speaker positions can be identified so that a relative distance between such speakers and a listener can be assessed.

At 502a, method 500 includes emitting an audio signal configured to cause a speaker to produce a test sound. For example, each speaker may emit one or more test sounds with one or more specific frequencies and/or amplitudes. Plural test sounds at different frequencies may be emitted from a speaker to determine the speaker volume levels within different frequency bands (e.g., if one speaker is behind a couch that absorbs high frequency sounds). The test sound(s) from each of two or more speakers may be different so that they can be identified from one another.

At 502b, method 500 includes tracking a position of a moving microphone in a plurality of depth images as captured by capture device 204, for example. For example, the player may hold a microphone and move about the speaker environment while the microphone listens to the test signal(s).

At 502c, method 500 includes correlating a perceived volume from a speaker with the position of the moving microphone. For example, the volume of a test sound emitted by a speaker as perceived by the moving microphone may be correlated with the position of the moving microphone. This correlation of perceived volume at different locations can be used to estimate a likely position of the speaker. For example, a gradient map of perceived sound can be created, and the speaker position can be estimated to be at a world space position that corresponds to the loudest perceived sounds on the gradient map.

The above method 502 of identifying a speaker position is nonlimiting. Virtually any method of identifying the position(s) of one or more speakers can be used without departing from the intended scope of this discloser. As another example, the player may go to the location of each speaker to indicate to the vision system where the speaker is positioned. In still another example, the player may describe the layout of the speakers relative to an initial player position through an interactive diagram on the display device.

At 504, method 500 includes regulating speaker volume based on a position of a player. The position of the player is tracked at 504a as described above with regard to FIG. 2, for example. For example tracking a position of a player may include recognizing the player in a depth image acquired from a depth camera. Recognizing the player in a depth image may further include identifying a three-dimensional position of the player, for example.

At 504b, method 500 includes, for each of one or more speakers, assessing a changing distance between that speaker and the player. For example, the changing distance between the player and the speakers may be assessed based on a map of speaker positions obtained in a speaker configuration step as described above. Assessing a changing distance between a player and a speaker may include calculating a distance between the position of that speaker and the position of the player at two or more different times. In a surround sound system, such as the examples shown in FIGS. 4A and 4B, assessment of the changing distance may include assessing a distance between the three-dimensional position of the player and a three-dimensional position of each of a plurality of surround sound speakers.

Figure 6A:
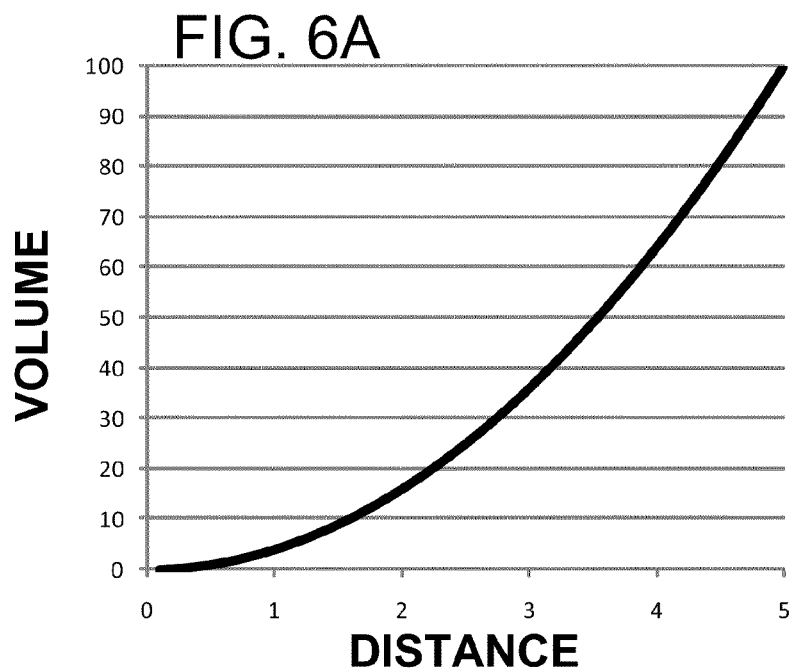
FIGS. 6A and 6B show example functions for adjusting audio output level as a function of distance.

At 504c, method 500 includes, for each of the one or more speakers, automatically adjusting a volume of that speaker in real-time based on a current distance between that speaker and the player. The automatic adjustment may include adjusting the volume of one or more speakers based on the current distance between the three-dimensional position of the speaker and a three-dimensional position of the player. In one example, the level of a given audio signal may be a title level volume for the given audio output. In another example, the adjustment may be made relative to an the audio level range based on the size of the space formed by the speakers In one example, the volume may be adjusted based on an exponential function of the current distance between a player and a speaker. FIG. 6A shows an example exponential function for adjusting audio output of a speaker as a function of the current distance. In FIG. 6A, as the distance between a player and a sound source increases, the volume of the speaker may be increased exponentially to compensate. An exponential function may be selected to compensate for an estimated inverse-squared decrease in volume as a function of distance.

Figure 6B:
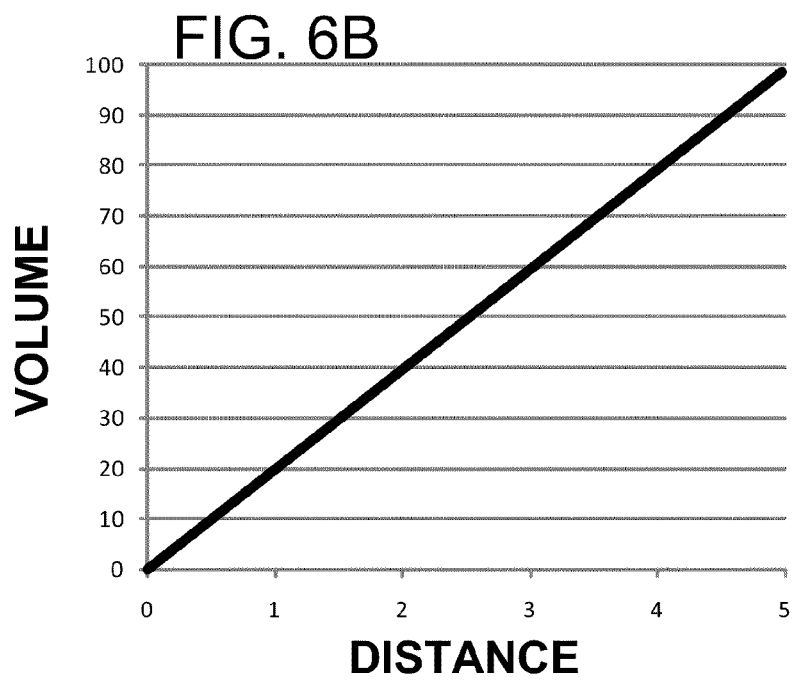

In another example, the volume may be adjusted based on a linear function of the current distance between a player and a speaker. FIG. 6B shows an example linear function for adjusting audio output of a speaker as a function of the current distance. In FIG. 6B as the distance between a player and a sound source increases, the volume of the speaker may be increased linearly to compensate.

Figure 7:
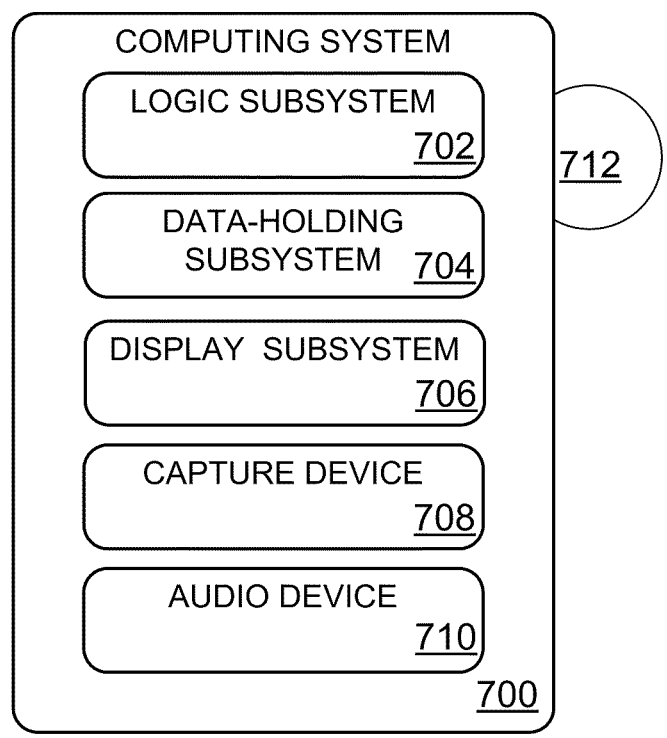
FIG. 7 schematically shows a computing system in accordance with an embodiment of present disclosure.

The methods and processes described herein may be tied to a variety of different types of computing systems. The computing system 202 described above is a nonlimiting example system which includes a gaming console, display device 206, and capture device 204. As another, more general, example, FIG. 7 schematically shows a computing system 700 that may perform one or more of the player tracking, speaker position identification, and volume regulation methods and processes described herein. Computing system 700 may take a variety of different forms, including, but not limited to, gaming consoles, personal computing systems, and audio/visual theaters, among others.

Computing system 700 may include a logic subsystem 702, a data-holding subsystem 704 operatively connected to the logic subsystem, a display subsystem 706, and/or a capture device 708. The computing system may optionally include components not shown in FIG. 7, and/or some components shown in FIG. 7 may be peripheral components that are not integrated into the computing system.

Logic subsystem 702 may include one or more physical devices configured to execute one or more instructions. For example, the logic subsystem may be configured to execute one or more instructions that are part of one or more programs, routines, objects, components, data structures, or other logical constructs. Such instructions may be implemented to perform a task, implement a data type, transform the state of one or more devices, or otherwise arrive at a desired result. The logic subsystem may include one or more processors that are configured to execute software instructions. Additionally or alternatively, the logic subsystem may include one or more hardware or firmware logic machines configured to execute hardware or firmware instructions. The logic subsystem may optionally include individual components that are distributed throughout two or more devices, which may be remotely located in some embodiments.

Data-holding subsystem 704 may include one or more physical devices configured to hold data and/or instructions executable by the logic subsystem to implement the herein described methods and processes. When such methods and processes are implemented, the state of data-holding subsystem 704 may be transformed (e.g., to hold different data). Data-holding subsystem 704 may include removable media and/or built-in devices. Data-holding subsystem 704 may include optical memory devices, semiconductor memory devices (e.g., RAM, EEPROM, flash, etc.), and/or magnetic memory devices, among others. Data-holding subsystem 704 may include devices with one or more of the following characteristics: volatile, nonvolatile, dynamic, static, read/write, read-only, random access, sequential access, location addressable, file addressable, and content addressable. In some embodiments, logic subsystem 702 and data-holding subsystem 704 may be integrated into one or more common devices, such as an application specific integrated circuit or a system on a chip.

FIG. 7 also shows an aspect of the data-holding subsystem in the form of computer-readable removable media 712, which may be used to store and/or transfer data and/or instructions executable to implement the herein described methods and processes.

Display subsystem 706 may be used to present a visual representation of data held by data-holding subsystem 704. As the herein described methods and processes change the data held by the data-holding subsystem, and thus transform the state of the data-holding subsystem, the state of display subsystem 706 may likewise be transformed to visually represent changes in the underlying data. Display subsystem 706 may include one or more display devices utilizing virtually any type of technology. Such display devices may be combined with logic subsystem 702 and/or data-holding subsystem 704 in a shared enclosure, or such display devices may be peripheral display devices.

Computing system 700 further includes a capture device 708 configured to obtain depth images of one or more targets and/or scenes. Capture device 708 may be configured to capture video with depth information via any suitable technique (e.g., time-of-flight, structured light, stereo image, etc.). As such, capture device 708 may include a depth camera, a video camera, stereo cameras, and/or other suitable capture devices.

For example, in time-of-flight analysis, the capture device 708 may emit infrared light to the scene and may then use sensors to detect the backscattered light from the surfaces of the scene. In some cases, pulsed infrared light may be used, wherein the time between an outgoing light pulse and a corresponding incoming light pulse may be measured and used to determine a physical distance from the capture device to a particular location on the scene. In some cases, the phase of the outgoing light wave may be compared to the phase of the incoming light wave to determine a phase shift, and the phase shift may be used to determine a physical distance from the capture device to a particular location in the scene.

In another example, time-of-flight analysis may be used to indirectly determine a physical distance from the capture device to a particular location in the scene by analyzing the intensity of the reflected beam of light over time via a technique such as shuttered light pulse imaging.

In another example, structured light analysis may be utilized by capture device 708 to capture depth information. In such an analysis, patterned light (e.g., light displayed as a known pattern such as a grid pattern or a stripe pattern) may be projected onto the scene. On the surfaces of the scene, the pattern may become deformed, and this deformation of the pattern may be studied to determine a physical distance from the capture device to a particular location in the scene.

In another example, the capture device may include two or more physically separated cameras that view a scene from different angles, to obtain visual stereo data. In such cases, the visual stereo data may be resolved to generate a depth image.

In other embodiments, capture device 708 may utilize other technologies to measure and/or calculate depth values.

In some embodiments, two or more different cameras may be incorporated into an integrated capture device. For example, a depth camera and a video camera (e.g., RGB video camera) may be incorporated into a common capture device. In some embodiments, two or more separate capture devices may be cooperatively used. For example, a depth camera and a separate video camera may be used. When a video camera is used, it may be used to provide target tracking data, confirmation data for error correction of scene analysis, image capture, face recognition, high-precision tracking of fingers (or other small features), light sensing, and/or other functions.

It is to be understood that at least some depth analysis operations may be executed by a logic machine of one or more capture devices. A capture device may include one or more onboard processing units configured to perform one or more depth analysis functions. A capture device may include firmware to facilitate updating such onboard processing logic.

Computing system 700 may further include an audio device 710. Audio device 710 may include one or more audio outputs configured to send audio signals to an amplifier and/or to different speakers in a surround sound system, for example. Audio device 710 may also include a microphone. Logic subsystem 702 may be operatively connected to the audio device 710 and the capture device 708.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

The subject matter of the present disclosure includes all novel and nonobvious combinations and subcombinations of the various processes, systems and configurations, and other features, functions, acts, and/or properties disclosed herein, as well as any and all equivalents thereof.

The invention claimed is:

1. A method of regulating volume, the method comprising:
receiving a stream of depth images generated by an arbitrarily-placed depth camera imaging a three-dimensional world space from a singular vantage point;
recognizing from the stream of depth images a position of a listener in the three-dimensional world space;
tracking a position of the listener within the three-dimensional world space in a plurality of depth images;
for each of one or more speakers within the three-dimensional world space, identifying in the plurality of depth images a three-dimensional position physically indicated by the listener and recognizing that three-dimensional position as the three-dimensional position of that speaker;
tracking a position of a listener relative to each of the one or more speakers within the three-dimensional world space;
for each of the one or more speakers, assessing a changing distance between that speaker and the listener in the three-dimensional world space; and
automatically adjusting a volume of each of the one or more speakers in real-time based on a current distance between each respective speaker and the listener.

2. The method of claim 1, where assessing the changing distance between that speaker and the listener includes calculating a distance between the position of that speaker and the position of the listener at two or more different times.

3. The method of claim 1, where automatically adjusting the volume of that speaker includes adjusting an audio output level as a function of the current distance.

4. The method of claim 3, where automatically adjusting the volume of that speaker includes exponentially adjusting an audio output level as a function of the current distance.

5. The method of claim 3, where automatically adjusting the volume of that speaker includes linearly adjusting an audio output level as a function of the current distance.

6. The method of claim 1, where identifying the three-dimensional position for each of the one or more speakers includes, for each speaker:
emitting an audio signal configured to cause that speaker to produce a test sound;
tracking a position of a moving microphone within the three-dimensional world space in a plurality of depth images; and
for each of a plurality of different positions of the moving microphone, correlating that position with a volume of the test sound as perceived by the microphone at that position.

7. A method of regulating volume, the method comprising:
receiving a stream of depth images generated by an arbitrarily-placed depth camera imaging a three-dimensional world space from a singular vantage point of a scene;
recognizing from the stream of depth images a listener in the depth image;
tracking a position of the listener within the three-dimensional world space in a plurality of depth images;
for each of a plurality of surround sound speakers within the three-dimensional world space, identifying in the plurality of depth images a three-dimensional position physically indicated by the listener and recognizing that three-dimensional position as the three-dimensional position of that speaker;
assessing a distance between the three-dimensional position of the listener and the three-dimensional position of each of the plurality of surround sound speakers; and
automatically setting a volume of each of the plurality of surround sound speakers based on the distance between the three-dimensional position of that speaker and the three-dimensional position of the listener.

8. The method of claim 7, where automatically setting the volume of each of the plurality of surround sound speakers includes adjusting an audio output level for that speaker as a function of the distance between the three-dimensional position of that speaker and the three-dimensional position of the listener.

9. The method of claim 7, where automatically setting the volume of each of the plurality of surround sound speakers includes exponentially adjusting an audio output level for that speaker as a function of the distance between the three-dimensional position of that speaker and the three-dimensional position of the listener.

10. The method of claim 7, where automatically setting the volume of each of the plurality of surround sound speakers includes linearly adjusting an audio output level for that speaker as a function of the distance between the three-dimensional position of that speaker and the three-dimensional position of the listener.

11. A computing system, comprising:
an audio output configured to send an audio signal to a speaker or amplifier;
a depth camera input configured to receive depth information useable to construct a depth image;
a logic subsystem operatively connected to the audio output and the depth camera; and
a data-holding subsystem holding instructions executable by the logic subsystem to:
receive a stream of depth images generated by an arbitrarily-placed depth camera imaging a three-dimensional world space from a singular vantage point;
recognize a listener in the stream of depth images;
identify from the stream of depth images a three-dimensional position of the listener in the three-dimensional world space;
for each of one or more speakers within the three-dimensional world space, identify from the plurality of depth images a three-dimensional position physically indicated by the listener and recognizing that three-dimensional position as the three-dimensional position of that speaker;
assess a distance between the three-dimensional position of the listener and the three-dimensional position of that speaker; and
automatically set a level of the audio signal based on the distance between the three-dimensional position of the listener and the three-dimensional position of the speaker.

12. The computing system of claim 11, where the audio output is one of a plurality of surround sound audio outputs, each surround sound audio output configured to send an audio signal to a different surround sound speaker.

13. The computing system of claim 11, where the data-holding subsystem holds instructions executable by the logic subsystem to automatically set the level of the audio signal as an exponential function of the distance between the three-dimensional position of that speaker and the three-dimensional position of the listener.

14. The computing system of claim 11, where the data-holding subsystem holds instructions executable by the logic subsystem to automatically set the level of the audio signal as a linear function of the distance between the three-dimensional position of that speaker and the three-dimensional position of the listener.

15. The computing system of claim 11, further comprising a microphone, and where the data-holding subsystem holds instructions executable by the logic subsystem to cause the audio output to emit an audio signal configured to cause the speaker to produce a test sound; track a position in a three-dimensional world space of the microphone in a plurality of depth images from the depth camera; and for each of a plurality of positions of the microphone, correlate a perceived volume of the audio signal with the position of the microphone.

16. The computing system of claim 11, where the depth camera includes a time-of-flight depth camera.

17. The computing system of claim 11, where the depth camera includes a structured light depth camera.

18. The computing system of claim 11, where the depth camera includes stereo depth cameras.

* * * * *